(12) United States Patent
Goda et al.

(10) Patent No.: US 8,514,629 B2
(45) Date of Patent: *Aug. 20, 2013

(54) METHOD FOR MEMORY CELL ERASURE WITH A PROGRAMMING MONITOR OF REFERENCE CELLS

(75) Inventors: Akira Goda, Boise, ID (US); Andrei Mihnea, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/602,762

(22) Filed: Sep. 4, 2012

(65) Prior Publication Data

US 2012/0327712 A1 Dec. 27, 2012

Related U.S. Application Data

(62) Division of application No. 13/082,965, filed on Apr. 8, 2011, now Pat. No. 8,264,885, which is a division of application No. 12/127,415, filed on May 27, 2008, now Pat. No. 7,924,623.

(51) Int. Cl.
*G11C 16/16* (2006.01)

(52) U.S. Cl.
USPC ............ 365/185.2; 365/185.22; 365/185.29; 365/185.11; 365/185.19; 365/185.17

(58) Field of Classification Search
USPC ............ 365/185.29, 185.33, 185.11, 185.19, 365/185.2, 185.22, 185.17
See application file for complete search history.

(56) References Cited

U.S. PATENT DOCUMENTS

| | | | |
|---|---|---|---|
| 5,568,423 A | 10/1996 | Jou et al. | |
| 6,115,291 A | 9/2000 | Lakhani | |
| 6,230,233 B1 | 5/2001 | Lofgren et al. | |
| 6,252,803 B1 | 6/2001 | Fastow | |
| 6,288,944 B1 | 9/2001 | Kawamura | |
| 6,345,001 B1 | 2/2002 | Mokhlesi | |
| 6,493,280 B2 | 12/2002 | Mihnea et al. | |
| 6,510,083 B1 | 1/2003 | See et al. | |
| 6,643,187 B2 | 11/2003 | Mokhlesi | |
| 6,732,221 B2 | 5/2004 | Ban | |
| 6,798,699 B2 | 9/2004 | Mihnea et al. | |
| 6,831,865 B2 | 12/2004 | Chang et al. | |
| 6,907,497 B2 | 6/2005 | Hosono et al. | |
| 7,035,967 B2 | 4/2006 | Chang et al. | |
| 7,099,220 B2 | 8/2006 | Mihnea et al. | |
| 7,149,121 B2 | 12/2006 | Lin et al. | |
| 7,224,604 B2 | 5/2007 | Lasser | |
| 7,263,006 B2 | 8/2007 | Aritome | |
| 7,924,623 B2 * | 4/2011 | Goda et al. | 365/185.2 |
| 8,264,885 B2 * | 9/2012 | Goda et al. | 365/185.2 |
| 2005/0219896 A1 | 10/2005 | Chen et al. | |
| 2007/0058435 A1 | 3/2007 | Chen et al. | |
| 2009/0103371 A1 | 4/2009 | Goda et al. | |

* cited by examiner

*Primary Examiner* — Andrew Q Tran
(74) *Attorney, Agent, or Firm* — Brooks, Cameron & Huebsch PLLC

(57) ABSTRACT

Embodiments of the present disclosure provide methods, devices, modules, and systems for operating memory cells. One method includes: performing an erase operation on a selected group of memory cells, the selected group including a number of reference cells and a number of data cells; performing a programming monitor operation on the number of reference cells as part of the erase operation; and determining a number of particular operating parameters associated with operating the number of data cells at least partially based on the programming monitor operation performed on the number of reference cells.

20 Claims, 9 Drawing Sheets

| | ERASE | ERASE VERIFY | PROGRAM MONITOR (WLref) | PROGRAM (WL1) |
|---|---|---|---|---|
| BL | FLOATING | 0 V | 0 V/Vcc | 0 V/Vcc |
| SGD | FLOATING | 5 V | 5V->Vcc | 5V->Vcc |
| WLref | 0 V | 0 V | Vpgm_mon | Vpass (10V) |
| WLn | 0 V | 0 V | Vpass (10V) | Vpass |
| ⋮ | ⋮ | ⋮ | ⋮ | ⋮ |
| WL2 | 0 V | 0 V | Vpass | Vpass |
| WL1 | 0 V | 0 V | Vpass | Vpgm |
| SGS | FLOATING | 5 V | 0 V | 0 V |
| SOURCE | FLOATING | 1.5 V | Vcc | Vcc |
| P-well (+N-well) | Vera=20 V | 0 V | 0 V | 0 V |

| # REFERENCE CELLS WITH Vt > Vt_ref | SET OF OPERATING TRIM VOLTAGES |
|---|---|
| 632-1 <X | setA |
| 632-2 X -> Y | setB |
| 632-3 > Y | setC |

| operating Voltage(V) | SetA | SetB | SetC |
|---|---|---|---|
| Vpgm_start | 14.0 | 13.5 | 13.0 |
| Vpgm_step | 0.6 | 0.5 | 0.4 |
| Vinh_start | 7.5 | 7.0 | 6.5 |
| EV | 0.0 | 0.1 | 0.2 |
| R1 | 0.0 | 0.1 | 0.2 |
| PV1 | 0.5 | 0.6 | 0.7 |
| R2 | 1.5 | 1.6 | 1.7 |
| PV2 | 2.0 | 2.1 | 2.2 |
| R3 | 3.5 | 3.6 | 3.7 |
| PV3 | 4.0 | 4.1 | 4.2 |

*Fig. 6B*

METHOD FOR MEMORY CELL ERASURE WITH A PROGRAMMING MONITOR OF REFERENCE CELLS

PRIORITY APPLICATION INFORMATION

This application is a Divisional of U.S. application Ser. No. 13/082,965, filed Apr. 8, 2011, to be issued as U.S. Pat. No. 8,264,885, which is a Divisional of U.S. application Ser. No. 12/127,415, filed May 27, 2008, issued as U.S. Pat. No. 7,924,623, the specifications of which are incorporated herein by reference.

TECHNICAL FIELD

The present disclosure relates generally to semiconductor devices and, more particularly, to memory devices having memory cells.

BACKGROUND

Memory devices are typically provided as internal, semiconductor, integrated circuits in computers, personal digital assistants (PDAs), digital cameras, and cellular telephones, among various other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Flash memory devices are utilized as non-volatile memory for a wide range of electronic applications. Flash memory devices typically use a one-transistor memory cell that allows for high memory densities, high reliability, and low power consumption.

Two common types of flash memory array architectures are the "NAND" and "NOR" architectures, so called for the logical form in which the basic memory cell configuration of each is arranged. In the NOR array architecture, the floating gate memory cells of the memory array are typically arranged in a matrix. The control gates of each floating gate memory cell of the array matrix are typically coupled by rows to access lines, e.g., word lines, and their drains are coupled to data lines, e.g., bit lines. The NOR architecture floating gate memory array is accessed by a row decoder activating a row of floating gate memory cells (i.e., those cells whose control gates are commonly coupled) by selecting the access line coupled to (and, in some cases, forming) their gates. The row of selected memory cells then place their data values on the data lines (wherein the cells commonly coupled to a particular data line are referred to as a "column") by flowing different currents depending on if a particular cell is in a programmed state or an erased state.

A NAND array architecture arranges its array of floating gate memory cells in a matrix such that the control gates of each floating gate memory cell of the array are coupled by rows to access lines. However, each memory cell is not directly coupled to a data line by its drain. Instead, the memory cells of the array are coupled together in series, source to drain, between a source line and a data line.

Flash memory cells can be programmed to a desired state. That is, electric charge can be placed on, or removed from, the floating gate of a memory cell to put the cell into any of a number of stored states. For example, a single level cell (SLC) can represent two states, e.g., a 1 or 0 state, such as to indicate a binary digit ("bit"). Flash memory multilevel memory cells, which can be referred to as multi-bit cells, or multi-state cells, can be programmed into more than two possible states, e.g., to store more than one bit of data per cell. MLCs allow the manufacture of higher density memories without increasing the number of memory cells since each cell can represent more than one bit. As an example, MLCs can have a number of program states and an erase state, e.g., a cell capable of representing four bits can have fifteen program states and an erase state, e.g., 1111, 0111, 0011, 1011, 1001, 0001, 0101, 1101, 1100, 0100, 1110, 1000, 1010, 0010, 0110, and 0000.

Program/erase cycling is one factor which can affect memory cell performance. Cycle endurance of a memory cell is dependent on the difference in a cell's threshold voltage, Vt, between the programmed state and the erased state. As the number of program/erase cycles increases, i.e., cycle endurance, cell current can decrease in some memory cells, resulting in subsequent data read errors. Increasing program/erase cycling is also associated with changes in memory performance, e.g., programming speed decreases and erase speed increases, as well as other changes in operational attributes. Slower programming speed may make the affected cells more susceptible to over-programming. For instance, when a voltage is applied to a particular cell, the conditioning of the cell may cause the cell to be over charged, thereby causing further cell degradation and an incorrect result when read and/or verified.

BRIEF DESCRIPTION OF THE DRAWINGS

FIG. 5A illustrates a table of operating voltages associated with performing various operations on data memory cells and reference memory cells in accordance with an embodiment of the present disclosure.

FIG. 6A illustrates a table showing a number of different sets of operating trim voltages that can be selected based on a programming monitor operation performed on a number of reference cells in accordance with an embodiment of the present disclosure.

FIG. 6B illustrates a table showing an example of a number of particular operating voltages corresponding to the sets of trim voltages shown in FIG. 6A in accordance with an embodiment of the present disclosure.

DETAILED DESCRIPTION

Embodiments of the present disclosure provide methods, devices, modules, and systems for operating memory cells. One method includes: performing an erase operation on a selected group of memory cells, the selected group including a number of reference cells and a number of data cells; performing a programming monitor operation on the number of reference cells as part of the erase operation; and determining a number of particular operating parameters associated with operating the number of data cells at least partially based on the programming monitor operation performed on the number of reference cells.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

Figure 1:
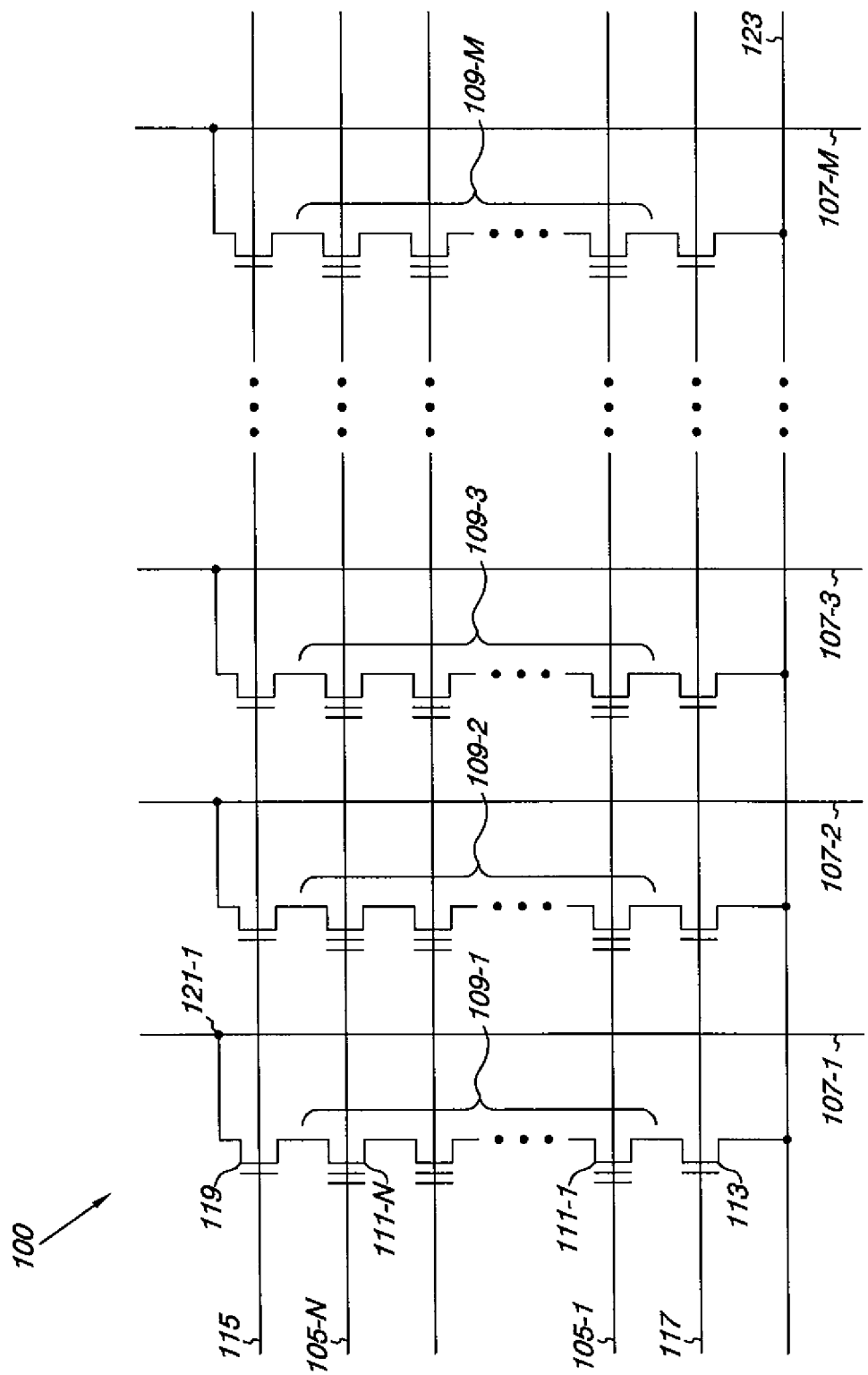
FIG. 1 is a schematic of a portion of a non-volatile memory array that can be used with one or more embodiments of the present disclosure.

FIG. 1 is a schematic of a portion of a non-volatile memory array 100 that can be used with one or more embodiments of the present disclosure. The embodiment illustrated in FIG. 1 is a NAND architecture non-volatile memory. However, embodiments described herein are not limited to this example.

As shown in the embodiment illustrated in FIG. 1, the memory array 100 includes word lines 105-1, . . . , 105-N and intersecting bit lines 107-1, . . . , 107-M. The indicators "M" and "N" are used to indicate that the array 100 can include a number of word lines and a number of bit lines.

For ease of addressing in the digital environment, the number of word lines 105-1, . . . , 105-N and the number of bit lines 107-1, . . . , 107-M can each be some power of two, e.g., 32 word lines by 4,096 bit lines. Embodiments are not limited to a particular number of word lines and/or bit lines. One of ordinary skill in the art will appreciate that the bit lines 107-1, . . . , 107-M can be coupled to sensing circuitry (not shown in FIG. 1) which can be used to determine the Vt level and/or state of a selected memory cell based on sensed current and/or voltage levels.

Memory array 100 includes NAND strings 109-1, 109-2, 109-3, . . . , 109-M. Each NAND string includes non-volatile memory cells 111-1, . . . , 111-N, each located at an intersection of a word line 105-1, . . . , 105-N and a local bit line 107-1, 107-2, 107-3, . . . , 107-M. The non-volatile memory cells 111-1, . . . , 111-N of each NAND string 109-1, 109-2, 109-3, . . . , 109-M are connected in series, source to drain between a select gate source (SOS) transistor, e.g., a field-effect transistor (FET) 113, and a select gate drain (SGD) transistor, e.g., FET 119. Source select gate 113 is located at the intersection of a local bit line 107-1 and a source select line 117, while drain select gate 119 is located at the intersection of a local bit line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In one or more embodiments, construction of non-volatile memory cells 111-1, . . . , 111-N includes a source, a drain, a floating gate or other charge storage node, and a control gate. Non-volatile memory cells, 111-1, . . . , 111-N, have their control gates coupled to an associated word line, 105-1, . . . , 105-N, respectively. Thus, a row of the non-volatile memory cells are commonly coupled to a given word line, e.g., 105-1, . . . , 105-N. A column of the non-volatile memory cells 111-1, . . . , 111-N make up the NAND strings, e.g., 109-1, 109-2, 109-3, . . . , 109-M, coupled to a given local bit line, e.g., 107-1, 107-2, 107-3, . . . , 107-M, respectively. A NOR array architecture would be similarly laid out with the exception that the string of memory cells would be coupled in parallel between the select gates.

As will be described further herein, in various embodiments, the array 100 can include a number of data cells and a number of reference cells. That is, the non-volatile memory cells 111-1, . . . , 111-N can include both data memory cells and reference memory cells. As such, in various embodiments, the reference cells are physically the same as the data cells, e.g., they both are floating gate memory cells.

Data memory cells can refer to memory cells used to store host/user data, and reference memory cells can refer to memory cells which are not used to store host/user data. As an example, in one or more embodiments, those memory cells, e.g., 111-1, . . . , 111-N, which are reference cells, can be used to perform programming monitor operations as described herein and/or can be used to store trim data associated with operating a particular memory cell block of a memory array, e.g., array 100.

In one or more embodiments, the array 100 can include one or more entire rows of reference cells. That is, in some embodiments, each of the memory cells in a particular row can be a reference memory cell, e.g., memory cell 111-1 of each string 109-1 to 109-M can be a reference cell. In one or more embodiments, the array 100 can include one or more entire columns of reference cells. That is, in some embodiments each of the memory cells in a particular column can be a reference memory cell. For instance, each of the memory cells 111-1 to 111-N in a particular string, e.g., 109-1 to 109-M, can be a reference cell. However, embodiments of the present disclosure are not limited to a particular configuration of data cells and reference cells. For instance, embodiments are not limited to a particular number of physical rows 105-1, . . . , 105-N or columns 107-1, . . . , 107-M of data memory cells or reference memory cells or to a particular number of reference cells or data cells. It is noted that use of the terms "row" and "column" are used to reflect logical associations and should not be interpreted to require any particular linear relationship or orientation.

The array 100 shown in FIG. 1 can represent a block of memory cells. A block of memory cells can refer to a number of memory cells, e.g., data cells and reference cells, which are erased together as a group. As one of ordinary skill in the art will appreciate, a memory array, e.g., array 200 described in connection with FIG. 2, can include a number of blocks of memory cells, e.g., blocks 216-0, 216-1, . . . , 216-B shown in FIG. 2.

As will be described further below in connection with subsequent figures, various aspects of memory cell operational performance can change as the quantity of program/erase cycles increase, e.g., current degradation, programming speed, etc. Various embodiments of the present disclosure include adjusting one or more operating parameters, e.g., trim voltages, associated with operating, e.g., erasing, programming, and/or reading, an array of non-volatile memory cells in response to such operational performance changes. Adjusting the operating parameters can improve operational performance, among other benefits.

As described further herein, in one or more embodiments of the present disclosure, a number of particular operating parameters, e.g., voltages, associated with operating the data memory cells of an array, e.g., array 100, can be selected based on a monitored program performance of a number of reference memory cells. For instance, a program monitor operation can be performed on the references cells, and the particular operating voltages used to program the data cells can be selected based thereon. In various embodiments, a number of operating voltages in a particular set of operating voltages used to program data cells can be adjusted based on the programming monitor operation performed on a number of reference cells.

In various embodiments, the programming monitor operation is performed as a part of an erase operation performed on a selected group, e.g., block, of memory cells. In one or more embodiments, the programming monitor operation is only performed on the reference memory cells of the selected group. In various embodiments, the operating voltages used to program the data cells of the selected group can be adjusted based on the programming monitor operation performed on the reference cells during the erase operation.

As described further below, in various embodiments, the operating voltages that can be adjusted can include programming voltages such as a programming start voltage, a step voltage between programming pulses, and a program verify voltage, among others. In various embodiments, an erase verify voltage and/or one or more read reference voltages associated with operating a number of data memory cells can be adjusted in response to the programming monitor operation performed on a number of reference cells.

Figure 2:
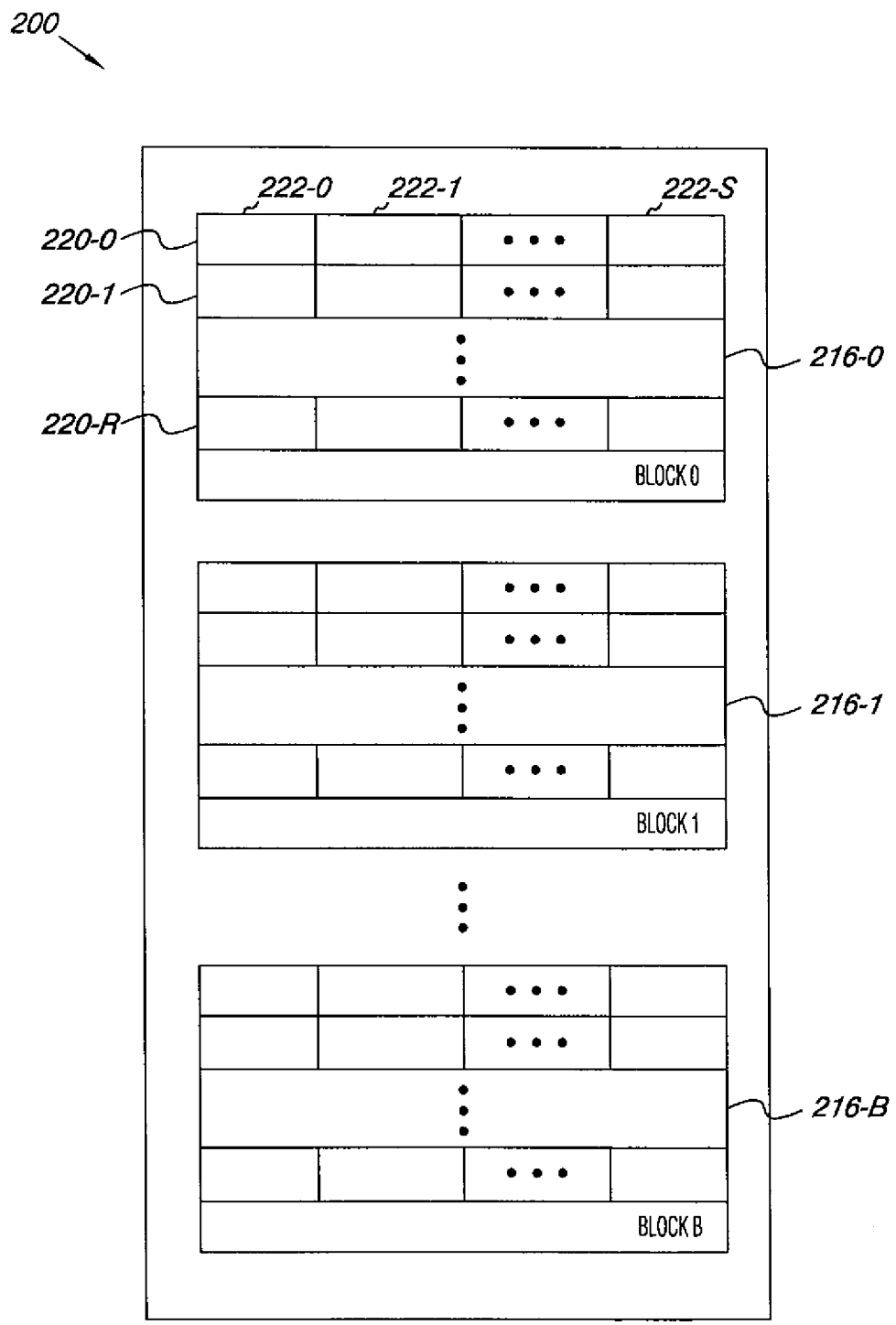
FIG. 2 illustrates a diagram of a memory array having a number of blocks that can be operated in accordance with embodiments of the present disclosure.

FIG. 2 illustrates a diagram of a memory array 200 having a number of blocks 216-0 (BLOCK 0), 216-1 (BLOCK 1), . . . , 216-B (BLOCK B) that can be operated in accordance with embodiments of the present disclosure. As an example, the number of memory blocks in array 200 may be 128 blocks, 512 blocks, or 1,024 blocks, but embodiments are not limited to a particular number of memory blocks in an array 200. In the embodiment illustrated in FIG. 2, the memory array 200 is, for example, a NAND flash memory array 200.

In one or more embodiments, the blocks 216-0, 216-1, . . . , 216-B are referred to as memory blocks or erase blocks. The indicator "B" is used to indicate that the array 200 can include a number of erase blocks. In such embodiments, the memory cells in each block 216-0, 216-1, . . . , 216-B can be erased together as a unit, e.g., the cells in each block can be erased in a substantially simultaneous manner. Each memory block, e.g., 216-0, 216-1, . . . , 216-B, contains a number of physical rows, e.g., 220-0, 220-1, . . . , 220-R, of memory cells coupled to a word line. The indicator "R" is used to indicate that a memory block, e.g., 216-0, 216-1, . . . , 216-B, can include a number of rows. In some embodiments, the number of rows, e.g., word lines, in each memory block can be 32, but embodiments are not limited to a particular number of rows 220-0, 220-1, . . . , 220-R, e.g., word lines, per block. In various embodiments, the number of blocks 216-0, 216-1, . . . , 216-B can each include a number of data cells and a number of reference cells.

In one or more embodiments, each block, e.g., 216-0, 216-1, . . . , 216-B, is separately associated with a particular set of operating voltages, e.g., trim voltages. In some such embodiments, the particular set of operating voltages associated with each block can be adjusted on a block by block basis such that one or more of a number of operating voltages associated with a particular block can vary from block to block. The adjustments to the operating voltages of a particular block can be based on a programming monitor operation performed on a number of reference cells in the particular block. In one or more embodiments, data corresponding to the adjusted operating voltages associated with the particular block, e.g., 216-0, 216-1, . . . , 216-B, can be stored in the memory cells of the particular block.

As one of ordinary skill in the art will appreciate, each row 220-0, 220-1, . . . , 220-R can store one or more pages of data. A page refers to a unit of programming and/or reading, e.g., a number of cells that are programmed and/or read together or as a functional group of memory cells. In the embodiment shown in FIG. 2, each row 220-0, 220-1, . . . , 220-R stores one page of data. However, embodiments of the present invention are not so limited. For instance, in some embodiments of the present invention, each row can store multiple pages of data. In some embodiments of the present invention, each row can store one or more even pages of data associated with even-numbered data lines, and one or more odd pages of data associated with odd-numbered data lines.

In one or more embodiments of the present invention, and as shown in FIG. 2, a page associated with the rows 220-0, 220-1, . . . , 220-R can store data in accordance with a number of logical sectors 222-0, 222-1, . . . , 222-S of data. The indicator "S" is used to indicate that a row, e.g., 220-0, 220-1, . . . , 220-R, can include a number of sectors. Each logical sector 222-0, 222-1, . . . , 222-S can store information representing a number of bytes of data, e.g., 256 bytes, 512 bytes, or 1,024 bytes, but embodiments are not limited to a particular number of logical sectors per row, or bytes of data stored in a logical sector 222-0, 222-1, . . . , 222-S. It is noted that other formats and/or configurations for the blocks 216-0, 216-1, . . . , 216-B, rows 220-0, 220-1, . . . , 220-R, sectors 222-0, 222-1, . . . , 222-S, and pages are possible. For example, the rows 220-0, 220-1, . . . , 220-R of the memory blocks 216-0, 216-1, . . . , 216-B can include a single sector which can include, for example, more or less than 512 bytes of data.

Figure 3A:
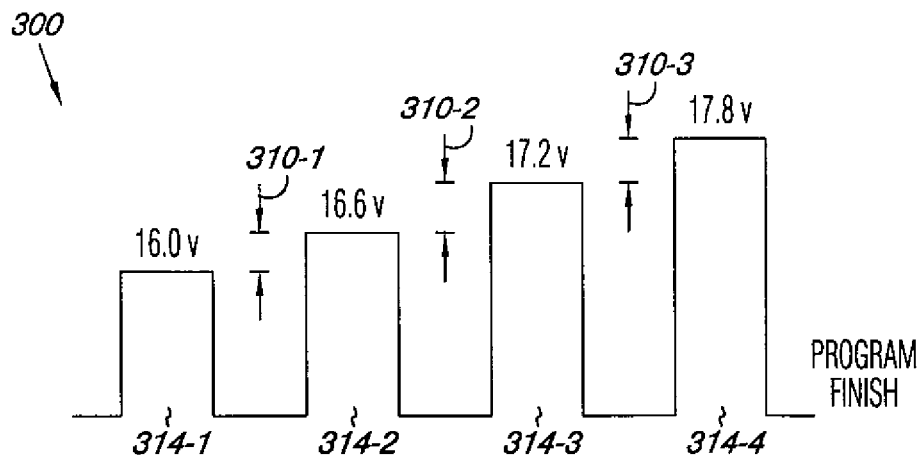
FIG. 3A illustrates an example of a number of voltage pulses that can be used to program data memory cells.

FIG. 3A illustrates an example of a number of voltage pulses 300 that can be used to program data memory cells. In the example shown in FIG. 3A, the voltage pulses 300 include a series of incremented programming pulses 314-1, 314-2, 314-3, and 314-4 that can be applied to a selected word line in order to program data memory cells to a particular threshold voltage (Vt) level corresponding to a desired data state. In this example, the magnitude of the initial programming pulse 314-1 is 16.0V and the magnitude of each of the subsequent programming pulses 314-2, 314-3, and 314-4 is incremented by 0.6V. That is, the voltage step 310-1 between pulses 314-1 and 314-2 is 0.6V, the voltage step 310-2 between pulses 314-2 and 314-3 is 0.6V, and the voltage step 310-3 between pulses 314-3 and 314-4 is 0.6V.

As one of ordinary skill in the art will appreciate, programming pulses can be applied to a selected word line until each of the particular memory cells within the row reach their desired program voltage level. An inhibit voltage can be applied to bit lines coupled to cells which have reached the desired voltage level to prevent, e.g., inhibit, the Vt level of those cells from being further increased due to subsequent programming pulses applied to the selected word line.

Figure 3B:
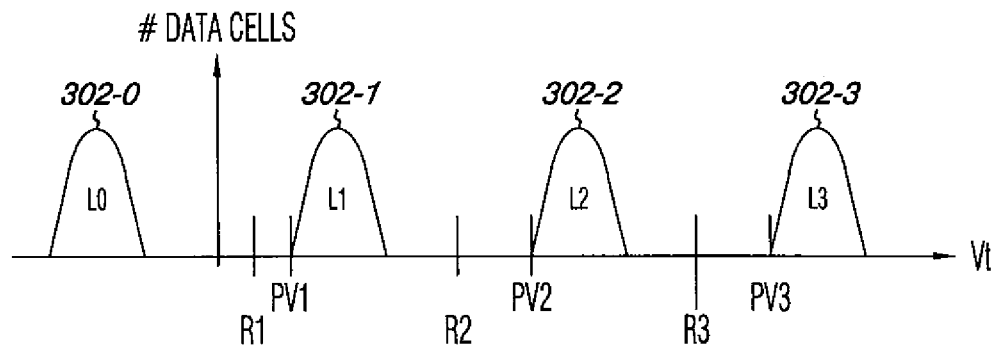
FIG. 3B illustrates a number of threshold voltage (Vt) distributions, read reference voltages, and program verify voltages associated with programmed data memory cells.

FIG. 3B illustrates a number of threshold voltage (Vt) distributions, read reference voltages, and program verify voltages associated with programmed data memory cells. The example shown in FIG. 3B is for two-bit, e.g., four-state, data memory cells. The Vt distributions 302-0, 302-1, 302-2, and 302-3 represent four states, e.g., L0, L1, L2, and L3, respectively, to which the memory cells can be programmed. In operation, the memory cells in a selected block are erased together such that they have a threshold voltage level within distribution 302-0 prior to being programmed. As such, distribution 302-0 can be referred to as an erase state and can represent a particular stored data state (L0), e.g., a stored data value such as a binary "11". Programming pulses, e.g., pulses 300 shown in FIG. 3A, can then be applied to the control gates, e.g., via a selected word line, of cells to be programmed to one of the data states L1, L2, and L3, e.g., such that their Vt level is within one of the distributions 302-1, 302-2, and 302-3, respectively.

A program verify operation can be performed between programming pulses to prevent memory cells from receiving further programming pulses once their Vt level has reached a desired level. For instance, data cells to be programmed to the L1 state are prevented from receiving further programming once their Vt level is determined, e.g., via a program verify operation, to be above the program verify level corresponding to the particular data state, e.g., PV1 for cells programmed to the L1 state. Similarly, data cells to be programmed to the L2 state are prevented from receiving further programming once their Vt level is determined to be above PV2 and data cells to be programmed to the L3 state are prevented from receiving further programming once their Vt level is determined to be above PV3.

In the example illustrated in FIG. 3B, the voltage levels R1, R2, and R3 represent read reference voltages used to distinguish between the data states L0, L1, L2, and L3 during a data read operation. Those of ordinary skill in the art will appreciate the manners in which read operations and program verify operations can be performed.

The quantity of program/erase operation cycles can affect memory cell performance characteristics. As an example, due to mechanisms such as charge trapping and/or detrapping associated with strings of memory cells, e.g., strings 109-1 to 109-M shown in FIG. 1, the time associated with programming and/or erasing memory cells can change over time. For instance, after a number of program/erase cycles performed on a block of memory cells, it often can take longer to erase memory cells, e.g., it can take a greater number of erase pulses applied to the memory cells in order to place the cells in an erased state. As another example, increased program/erase cycle counts associated with a block of memory cells can cause the memory cells to be programmed in a shorter amount of time. For instance, it can take fewer programming pulses for the memory cells to reach the desired program state after the memory cells have experienced a number of program/erase cycles than it took to program the same cells prior to experiencing the program/erase cycling. Such changes to memory cell operating characteristics can have adverse consequences such as current degradation associated with performing memory cell read operations and/or effecting the location and/or width of Vt distributions, e.g., 302-0, 302-1, 302-2, and 302-3, which can have adverse effects on data reliability and/or integrity, among various other adverse effects.

Figure 5B:
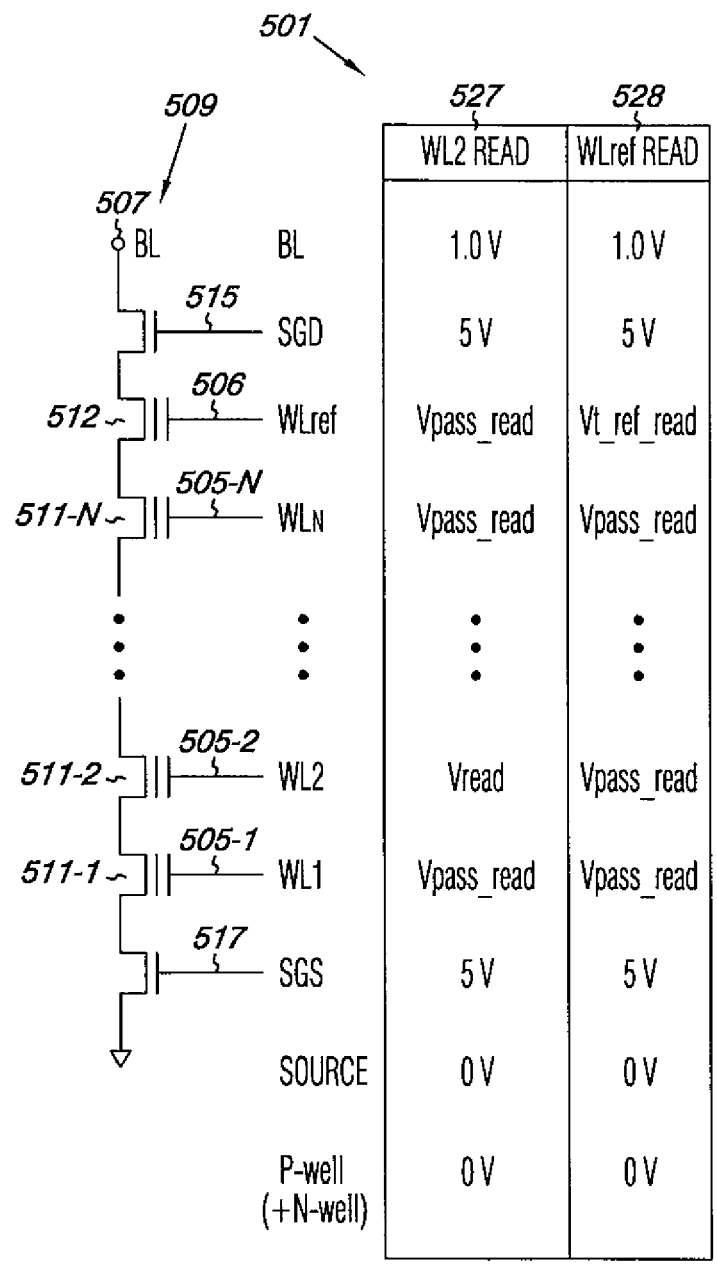
FIG. 5B illustrates a table of operating voltages associated with performing a read operation on data memory cells and reference memory cells in accordance with an embodiment of the present disclosure.

For instance, as one of ordinary skill in the art will appreciate, in a read operation performed on a selected memory cell in a NAND string, the unselected memory cells of the string are biased so as to be in a conducting state. An example of operating parameters, e.g., voltages, associated with a read operation is shown in FIG. 5B. In such a read operation, the data stored in the selected cell can be based on the current and/or voltage sensed on the sense line, e.g., bit line, corresponding to a particular string. For example, the logical value of data stored in a selected cell can be determined based on whether the bit line current changes by a particular amount, or reaches a particular level within a given time period.

When the selected cell is in a conductive state, current flows between the source line contact at one end of the string and a drain line contact at the other end of the string. As such, the current associated with reading the selected cell is carried through each of the other cells in the string, including the respective diffused regions between cell stacks, and the select transistors. Therefore, current reduction associated with each of the cells in the string, e.g., the diffused regions between cells and/or the select gates, can cumulatively reduce the current associated with reading a selected cell. Memory cells affected by current degradation can become unreliable due to the reduced current associated with the selected cell of the string. For instance, current reduction may be large enough to indicate a different logical data value when being read than the logical data value written to the cells.

One example of an approach for adjusting operating parameters is described in co-pending, co-assigned U.S. patent application Ser. No. 11/876,406, entitled, "Memory Cell Operation", filed on Oct. 22, 2007, also having common inventorship, the specification being incorporated herein in full by reference.

In some previous approaches, the number of program/erase cycles performed on a memory block, e.g., memory block 216-0, 216-1, . . . , 216-B, can be monitored. In some such previous approaches, the quantity of program/erase cycles performed on a memory block is referred to as an "experience count," or "hot count." The hot count of a memory array, and/or of each memory block within the memory array, can be monitored by control circuitry, e.g., a controller. In some previous approaches that monitor the hot count, adjusted programming voltages can be used for programming memory cells after one or more predetermined number of program/erase cycles has been reached. However, in such embodiments, it can be difficult to adequately correlate the hot count and the adjusted programming voltages in order to properly program the memory cells to the desired data states.

In contrast, one or more embodiments of the present disclosure monitor the programming performance of a number of reference cells in response to a programming monitor operation performed on the reference cells as a part of an erase operation. In various embodiments, the erase operation is performed prior to programming of a number of data cells, e.g., the programming monitor operation is performed on the reference cells prior to programming of the data cells. As described above, a particular set of trim voltages are associated with the data cells and used to perform erase, program, and/or read operations on the data cells. One or more embodiments of the present disclosure can provide dynamic programming trim voltages by adjusting one or more of the trim voltages of the particular set of trim voltages associated with the data cells based on the monitored program performance of the reference cells.

As described further below, in various embodiments, monitoring the program performance of the number of reference cells can include determining an amount of the number of reference cells having a threshold voltage above a particular voltage level in response to the programming operation performed on the number of reference cells. As used herein, a programming operation performed on a number of reference cells as a part of an erase operation can be referred to as a programming monitor operation. An example of operating voltages used to perform a programming monitor operation in accordance with embodiments of the present disclosure is described further in connection with FIGS. 4 and 5A.

Figure 4:
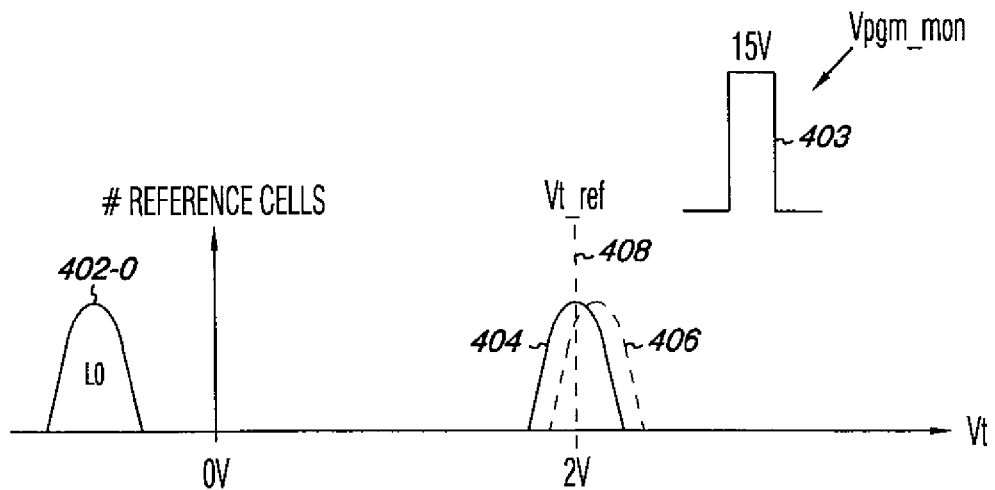
FIG. 4 illustrates a number of Vt distributions associated with a programming monitor operation performed on reference memory cells in accordance with an embodiment of the present disclosure.

FIG. 4 illustrates a number of Vt distributions associated with a programming monitor operation performed on reference memory cells in accordance with an embodiment of the present disclosure. In the embodiment illustrated in FIG. 4, the Vt distribution 402-0 represents the Vt levels of a number of reference cells which have been erased. As noted above, in various embodiments, the number of reference cells and the number of data cells within a group of memory cells such as a block, for instance, can be erased together in a substantially simultaneous manner. As such, the data cells and memory cells experience the same or similar program/erase cycling effects.

In the embodiment illustrated in FIG. 4, the Vt distributions 404 and 406 represent the Vt levels of a number of reference cells which have received a particular programming monitor pulse, e.g., a pulse such as Vpgm_mon 403 as shown, during a programming monitor operation in accordance with embodiments of the present disclosure. Both of the distributions 404 and 406 represent the Vt levels of the same group of memory cells, which have been erased and then have received the same particular programming monitor pulse, e.g., the same magnitude and duration. However, the Vt distribution 406 represents the Vt levels of the group of reference cells later in time than Vt distribution 404. That is, the Vt distribution 406 illustrates the Vt levels of the group of reference cells after experiencing a greater number of programming/erase cycles.

As described above, programming/erase cycling can cause memory cells to be programmed faster for the same programming pulse. As such, FIG. 4 illustrates this faster programming by showing the distribution 404 has shifted to distribution 406. That is, the Vt levels of the group of reference cells that receive the Vpgm_mon pulse 403 have increased due to increased program/erase cycling.

In various embodiments, a particular voltage level can be associated with and used in a programming monitor operation. For instance, in the embodiment shown in FIG. 4, a particular voltage reference level 408 (Vt_ref) can be used to measure Vt level shifts associated with the group of reference cells undergoing a programming monitor operation. That is, after the reference cells have received the programming monitor pulse 403, a read operation can be performed in which the Vt level of each of the reference cells is compared to the reference voltage 408. Over time, as the Vt levels of the reference cells shift due to program/erase cycling, more and more of the reference cells will have a Vt level greater than the reference level 408, e.g., 2.0V in this example. For instance, as shown in FIG. 4, more reference cells within distribution 406 have a Vt level greater than Vt_ref than those within distribution 404.

As such, comparing the Vt levels of the reference cells, which have received a programming monitor pulse, e.g., 403, to a particular reference level, e.g., 408, can be used to monitor programming performance of the reference cells. As discussed above, the programming performance of the reference cells correlates with the programming performance of the associated data cells. Therefore, operating voltages associated with programming the data cells can be adjusted based on the monitored program performance of the reference cells, e.g., based on the performance of the reference cells in response to the program monitor operation performed on the reference cells as part of an erase opertion. As described further below, in various embodiments, adjusting the operating voltages associated with programming data cells can include decreasing the magnitude of an initial programming pulse of a series of incremented pulses used to program the data cells and/or decreasing the magnitude of the step size associated with the series of incremented programming pulses.

As described further in connection with FIGS. 5A and 5B, performing a programming monitor operation on a group of reference cells in accordance with embodiments of the present disclosure can include applying the programming monitor pulse, e.g., Vpgm_mon 403, to the control gate of each of a group of erased reference cells to alter the Vt level of the reference cells. In various embodiments, the programming monitor operation includes determining a quantity of the reference cells whose threshold voltage reaches a particular level, e.g., level 408, in response to the applied programming monitor pulse, e.g., 403. In one or more embodiments, the level 408 can be a predetermined level, e.g., 2 volts in the example shown in FIG. 4.

Determining the quantity of reference cells whose threshold voltage reaches the reference level, e.g., 408, can include sensing a current conducted by a number of bit lines to which the number of reference cells are coupled. As an example, reference cells having a Vt level greater than the reference level will conduct current during a read operation and reference cells having a Vt level less than the reference level will not conduct current in response to the read operation. In one or more embodiments, a total amount of sensed current during a read operation performed on the reference cells correlates to a particular quantity of reference cells having a Vt level greater than the particular reference level.

In the embodiment illustrated in FIG. 4, the particular reference level 408 is 2.0V and the magnitude of the monitoring pulse 403 is 15.0V. However, embodiments are not limited to a particular reference level 408 or to a particular monitoring pulse 403 magnitude. In one or more embodiments, the particular reference level, e.g., 408, and/or the magnitude of the program monitoring pulse, e.g., 403, can be adjusted based on factors such as the hot count associated with a block of memory cells and/or the quantity of reference cells whose Vt level reaches the reference level in response to the monitoring pulse, among other factors.

FIG. 5A illustrates a table 500 of operating voltages associated with performing various operations on data memory cells and reference memory cells in accordance with an embodiment of the present disclosure. FIG. 5B illustrates a table 501 of operating voltages associated with performing a read operation on data memory cells and reference memory cells in accordance with an embodiment of the present disclosure.

Tables 500 and 501 each illustrate operating voltages associated with operating a string 509 of memory cells having a number of data memory cells and a reference memory cell in accordance with an embodiment of the present disclosure. The string 509 shown in the embodiment illustrated in FIGS.

5A and 5B is configured in a similar manner as NAND strings 109-1 to 109-M described in connection with FIG. 1.

In the embodiment of FIGS. 5A and 5B, the string 509 includes a number of word lines 505-1 (WL1), 505-2 (WL2), . . . , 505-N (WLn) coupled to the control gates of data memory cells 511-1, 511-2, . . . , 511-N and a word line 506 (WLref) coupled to the control gate of a reference cell 512. In this embodiment, the reference word line 506 is adjacent to a drain select line 515, and the data word line 505-1 is adjacent to a source select line 517. As described above in connection with FIG. 1, in one or more embodiments of the present disclosure, a NAND array of non-volatile memory cells can include any number of strings configured such as string 509 shown in the embodiment illustrated in FIGS. 5A and 5B.

Table 500 illustrates operating voltages, e.g., bias conditions, associated with performing an erase operation 523 (ERASE) and an erase verify operation 524 (ERASE VERIFY) on the number of data cells and reference cells in a string of memory cells, e.g., string 509.

The memory cells can be erased in groups, such as in blocks or other functional units as will be appreciated by those of ordinary skill in the art. One example of a process to erase a group of memory cells includes selecting the block of memory cells to be erased. The block of memory cells is erased by creating a potential difference between a control gate and substrate region, e.g., a well region, which removes charge from the floating gate of the memory cell. In the example shown in FIG. 5A, the erase operation 523 involves applying a ground voltage, e.g., 0V, to each of the word lines of the selected block and applying one or more 20V voltage pulses to a well region.

The erase verification operation, e.g., 524, can be performed to determine whether the Vt level of the memory cells being erased have reached a satisfactory voltage level. Additional erase pulses can be applied until satisfactory erasure to a particular Vt level has occurred and has been verified. As one of ordinary skill in the art will appreciate, after a selected block of memory cells has been erased and verified, a soft-programming operation and verification operation can be performed to prepare the memory cells for a programming operation such as program operations 525 and/or 526 described below. For instance, a soft-programming operation can be performed on memory cells in order to ensure the Vt levels of the cells to be programmed have a similar value, e.g., each of the cells have a Vt level within a Vt distribution such as erase distribution 302-0 shown in FIG. 3B.

Table 500 also illustrates operating voltages associated with performing a programming monitor operation 525 (PROGRAM MONITOR) on one or more reference cells coupled to a selected word line, e.g., word line 506 (WLref) in this example, in accordance with an embodiment of the present disclosure. As one of ordinary skill in the art will appreciate, a row decoder (not shown) can select word lines coupled to reference cells on which a programming monitor operation is to be performed based on received address signals. In various embodiments, a programming monitor operation such as operation 525 can be performed on reference cells, e.g., 512, within a selected block of memory cells prior to user data being programmed to data cells, e.g., 511-1 to 511-N, within the selected block.

In one or more embodiments, a programming monitor operation can include applying a programming monitor voltage signal, e.g., signal Vpgm_mon 403 shown in FIG. 4, to the reference cells within a selected block of memory cells. The programming monitor operation 525 illustrated in Table 500 includes applying a pass through voltage, e.g., Vpass, to the unselected word lines in the selected block, while applying a programming monitor pulse Vpgm_mon to the selected word line, e.g., WLref in this example. Although in this example, only one of the word lines of string 509 is coupled to a reference cell, embodiments are not limited to a particular number of reference cells, e.g., 512, per word line. In various embodiments in which a string includes more than one reference cell, a programming operation can be performed on each of the reference cells, e.g., a programming monitor pulse Vpgm_mon having a particular magnitude can be applied to the control gate of each reference cell.

As described above in connection with FIG. 4, the voltage pulse Vpgm_mon applied to reference cells during a programming monitor operation, e.g., 525, can increase the Vt level of the reference cells. In various embodiments, the programming performance of the reference cells can be monitored by determining the amount of reference cells having a Vt level above a particular Vt level, e.g., Vt_ref shown in FIG. 4, in response to the applied Vpgm_mon pulse. The magnitude of the programming monitor pulse Vpgm_mon can be a particular value, e.g., 13V, 14V, or 15V. In one or more embodiments, the value of the programming monitor pulse Vpgm_mon can be predetermined. Embodiments of the present disclosure are not limited to a particular programming monitor pulse magnitude. The magnitude of the programming monitor pulse can be selected based on factors such as the magnitude of a prior voltage signal used to program the data cells of the selected block, or the particular reference level, e.g., Vt_ref used in the programming monitor operation, among other factors.

In one or more embodiments in which a programming monitor operation is performed on the reference cells within a selected block prior to programming the data cells of the selected block, a set of particular operating voltage values associated with operating the data cells can be based on the program performance of the reference cells. As an example, a particular set of operating voltages used to program the data cells within a selected block can be selected based on the number of reference cells whose Vt level is greater than the preselected reference Vt level, e.g., Vt_ref shown in FIG. 4, in response to the applied programming monitor signal Vpgm_mon.

In various embodiments, one or more particular operating voltages used to program the data cells in a previous programming operation can be adjusted based on the programming monitor operation, e.g., 525, performed on the reference cells of the selected block. For instance, prior to a programming monitor operation in accordance with embodiments of the present disclosure, a particular set of operating voltages would be used to program the data cells within a selected block, e.g., a particular initial programming start voltage magnitude and/or a particular step voltage magnitude associated with incremented programming pulses, among other operating voltages. In various embodiments of the present disclosure, one or more of the particular operating voltages previously used to program the data cells of a selected block can be adjusted based on the programming performance of the reference cells within the selected block in response to the programming monitor operation, e.g., based on the quantity of reference cells determined to have a Vt level greater than the particular reference level associated with the programming monitor operation. Determining the quantity of reference cells having a Vt level greater than the particular reference level can include performing a read operation such as read operation 528 described below in connection with FIG. 5B.

Table 500 also illustrates operating voltages associated with performing a programming operation 526 (PROGRAM)

on one or more data cells coupled to a selected word line, e.g., word line 505-1 (WL1) in this example. As one of ordinary skill in the art will appreciate, a row decoder (not shown) can select word lines coupled to particular data cells based on received address signals.

As described above in connection with FIGS. 3A and 3B, a programming operation can include applying a programming voltage signal, e.g., Vpgm as shown in FIG. 5A, to a selected word line in order change the Vt level of data cells to a desired value indicative of a particular data state. The programming signal (Vpgm) can be a series of incremented program pulses such as those shown in FIG. 3A. The initial programming pulse of the series, e.g., pulse 314-1 shown in FIG. 3A, can be referred to as the programming start voltage (Vpgm_start) and the magnitude of the voltage steps between pulses, e.g., 310-1 to 310-3 shown in FIG. 3A, can be referred to as the programming step voltage (Vpgm_step).

In one or more embodiments, parameters of the programming signal (Vpgm) used to program the data cells of a selected block, e.g., Vpgm_start and Vpgm_step, are adjusted, before the programming process, based on a programming monitor operation, e.g., 525, performed on reference cells of the selected block. The specific adjustments made to the programming parameters may be based, for example, at least partially on the quantity of reference cells determined to have a Vt level above a particular reference level such as Vt_ref discussed above. In various embodiments, other operating parameters, e.g., voltages, associated with processes involving erasing, erase verification, and/or reading data cells of a selected block, can be adjusted based on the programming monitor operation performed on the reference cells of the selected block.

FIG. 5B illustrates a table 501 of operating voltages associated with performing a read operation on data memory cells and reference memory cells in accordance with an embodiment of the present disclosure.

Table 501 illustrates operating voltages, e.g., bias conditions, associated with performing a read operation 527 (WL2 READ) on one or more data cells coupled to a selected word line, e.g., word line 405-2 (WL2) in this example. As shown in table 501, the read operation 527 performed on data cell 511-2 coupled to selected word line 505-2 includes applying a read reference voltage (Vread), e.g., R1, R2, or R3 shown in FIG. 3B, to the selected word line 405-2.

The read operation 527 includes applying a pass through voltage to unselected word lines such that unselected cells in string 509 operate in a conducting mode, e.g., the unselected cells in string 509 are turned on and pass current without regard to the Vt level of the unselected cells. In the example illustrated in table 501, the unselected word lines, e.g., the unselected ones word lines 505-1 through 505-N and 506, are biased at pass through voltage Vpass_read during the read operation 527.

In the example shown in table 501, the read operation 527 includes biasing the bit line 507 (BL) at 1.0V, biasing the common source line (SOURCE) at 0V, and biasing a well region (P-well) associated with the string 509 at 0V. As one of ordinary skill in the art will appreciate, the bit line 507 can be precharged to 1.0V in a read operation.

In this example, drain select line 515 and the source select line 517 are biased at a voltage, e.g., 5V, which is sufficient to turn on the respective drain select gate (SGD) and source select gate (SGS) transistors. Under the biasing conditions shown in table 501, voltage and/or current levels on bit line 507 in response to the particular applied read reference voltage Vread, can be sensed by sensing circuitry (not shown) in order to determine a particular state, e.g., state L0, L1, L2, or L3 shown in FIG. 3B, of the selected data cell 505-2.

Table 501 also illustrates bias conditions associated with performing a read operation 528 (WLref READ) on one or more reference cells coupled to a selected word line, e.g., word line 506 (WLref), in accordance with an embodiment of the present disclosure. As shown in table 501, in this embodiment, the read operation 528 performed on reference cell 512 coupled to selected word line 506 includes applying a read reference voltage (Vt_ref_read), e.g., Vt_ref shown in FIG. 4, to the selected word line 506. As illustrated in table 501, the read operation 528 includes biasing the unselected word lines 505-1, 505-2, . . . , 505-N, e.g., word lines coupled to data memory cells, at pass through voltage Vpass_read.

As shown in table 501, in this embodiment, the read operation 528 includes biasing the bit line 507 (BL) at 1.0V, biasing the common source line (SOURCE) at 0V, and biasing the well region (P-well) associated with the string 509 at 0V. In this embodiment, during read operation 528, the drain select line 515 and the source select line 517 are biased at a voltage, e.g., 5V in this example, sufficient to turn on the respective drain select gate (SGD) and source select gate (SGS) transistors. Under the biasing conditions shown in table 501, voltage and/or current levels on bit line 507 in response to the particular applied read reference voltage Vt_ref_read, can be sensed by sensing circuitry (not shown) in order to determine whether the Vt level of the selected reference cell 512 is greater or less than a particular reference level, e.g., Vt_ref shown in FIG. 4.

The determination of whether or not the selected reference cell, e.g., 512, has a Vt level greater or less than the particular reference level in response to the programming monitor operation, e.g., 525, can be based on whether or not the reference cell conducts current in response to the particular applied read reference voltage, e.g., Vt_ref_read. For instance, if sensing of the bit line 507 determines the selected reference cell 512 to be in a non-conducting state, e.g., turned off, in response to the applied read reference voltage Vt_ref_read, then the reference cell has a Vt level greater than Vt_ref_read. If sensing of the bit line 507 determines the selected reference cell 512 to be in a conducting state, e.g., turned on, in response to the applied read reference voltage Vt_ref_read, then the reference cell has a Vt level less than Vt_ref_read.

In various embodiments, the particular read reference voltage level, e.g., Vread, applied to a selected data cell, e.g., 505-2, during a read operation, e.g., 527, can be determined based on a read operation, e.g., 528, performed on one or more reference cells, e.g., 512. For instance, one or more of the particular read reference voltages, e.g., R1, R2, and R3 shown in FIG. 3B, used to determine the state of a data cell, can be adjusted based on the number of reference cells whose Vt level is determined to have reached a particular level, e.g., Vt_ref shown in FIG. 4, in response to a programming monitor operation, e.g., 525, performed on the reference cells.

Embodiments of the present disclosure are not limited to the example voltages shown in tables 500 and 501. For instance, embodiments of the present disclosure are not limited to read operations in which the bit line 507 (BL) is biased at 1.0V and in which the common source line (SOURCE) and the well region (P-well) are biased at 0V, e.g., a ground voltage. For instance, in various embodiments, the bit line sensing voltage, e.g., the voltage applied to BL 507 during a read or program verify operation, can be within a range of about 0.1V to 4V. In various embodiments, the common source line (SOURCE) can be biased at a voltage of between about 0V and about 4V during a sensing operation such as a read or program verify operation. Varying the bit line sensing voltage and/or common source line voltage can be used to extend the usable Vt range to negative values, i.e., to expand the usable programming window. Such sensing can be referred to as sensing with back-bias and can extend the programming window from a 0V to 4V window to a −4V to 4V window, for instance.

In one or more embodiments of the present disclosure, the read operation 528 can be performed on reference cells that have undergone a programming monitor operation, e.g., 525 described above, in order to determine an amount of the reference cells which have a reached a particular Vt level, e.g., to determine whether the Vt level of the reference cell is greater than or less than a particular reference voltage. As described above, as the memory cells of a block experience more and more program/erase cycles, their Vt levels will increase by greater amounts in response to the same applied programming pulse or pulses, which can result in effects such as over-programming. Embodiments of the present disclosure can compensate for effects caused by increased program/erase cycling experience by memory cells by adjusting one or more operating voltages associated with programming data memory cells based, at least partially, on a programming monitor operation performed on reference memory cells prior to programming the data cells.

FIG. 6A illustrates a table 600 showing a number of different sets of operating trim voltages, e.g., setA, setB, and setC, which can be selected based on a programming monitor operation, e.g., operation 525 shown in FIG. 5A, performed on a number of reference cells in accordance with an embodiment of the present disclosure. A set of operating trim voltages can include operating voltages associated with various operations such as programming, program verification, erasing, erase verification, reading, and soft-programming, among other operations associated with an array of memory cells, e.g., array 100 shown in FIG. 1.

In the embodiment illustrated in table 600, each set of operating voltages (setA, setB, and setC) represents a different set of particular operating voltages that can be selected and used to operate data memory cells of a selected block. Examples of the particular operating voltages within each of the sets (setA, setB, and setC), as well as examples of the particular voltage values associated with each set are illustrated in FIG. 6B.

As described above, in various embodiments, the particular set of operating trim voltages selected for use in programming a selected group, e.g., block, of data cells, can be based on the programming performance of the reference cells in the selected block in response to a programming monitor operation in accordance with embodiments of the present disclosure. For instance, in the embodiment illustrated in FIG. 6A, the set of trim voltages selected for use in programming the data cells in a selected block depends on the number of the reference cells determined to have a Vt level greater than a particular threshold level, e.g., Vt_ref, in response to the applied voltage pulse associated with the programming monitor operation, e.g., Vpgm_mon as described in connection with FIGS. 4 and 5A.

As described above, the number of reference cells whose Vt level is above the particular threshold voltage level associated with a particular programming monitor operation can change as the program/erase cycling associated with the selected block increases. For instance, as described in connection with FIG. 4, as the program/erase cycling increases, the Vt distribution associated with the number of reference cells receiving the program monitor signal can be shifted. The shifted Vt distribution can be due to cycling effects such as charge trapping between memory cells, which can result in faster programming of the memory cells. The Vt distribution shift associated with the reference cells in response to a programming monitor operation can be correlated to similar Vt level shifts associated with data cells of a selected block. As such, various embodiments of the present disclosure include adjusting one or more operating voltages associated with programming data cells based on the quantity of reference cells determined to have a Vt level greater than a particular reference level in response to an applied programming monitor signal, e.g., Vpgm_mon shown in FIG. 4.

For instance, row 632-1 of table 600 illustrates a set of operating voltages, e.g., setA, that can be selected for use in programming the data cells of a selected block when the number of reference cells determined to have a Vt level greater than the reference level, e.g., Vt_ref, in response to the programming monitor pulse is less than some number "X." Row 632-2 of table 600 illustrates a set of operating voltages, e.g., setB, that can be selected for use in programming the data cells of the selected block when the number of reference cells determined to have a Vt level greater than the reference level, e.g., Vt_Ref, in response to the programming monitor pulse is between "X" and some number "Y." Row 632-3 of table 600 illustrates a set of operating voltages, e.g., setC, that can be selected for use in programming the data cells of a selected block when the number of reference cells determined to have a Vt level greater than the reference level, e.g., Vt_ref, in response to the programming monitor pulse is greater than "Y." The numbers "X" and "Y" can be a particular number of reference cells and/or can represent a percentage of the number of reference cells.

FIG. 6B illustrates a table 601 showing an example of a number of particular operating voltages corresponding to the sets of trim voltages shown in FIG. 6A. In table 601, column 633-1 illustrates particular voltage values corresponding to the particular operating voltage parameters associated with trim voltage setA, column 633-2 illustrates particular voltage values corresponding to the particular operating voltage parameters associated with trim voltage setB, and column 633-3 illustrates particular voltage values corresponding to the particular operating voltage parameters associated with trim voltage setC.

In the example illustrated in table 601, the particular operating voltage parameters associated with each of the sets of trim voltages, e.g., setA, setB, and setC, include a program start voltage 634 (Vpgm_start), a program step voltage 635 (Vpgm_step), a program inhibit start voltage 636 (Vinh_start), and an erase verify voltage 637 (EV). The program start voltage 634 is the magnitude of an initial programming voltage pulse of a series of voltage pulses applied to a selected word line during a programming operation performed on data cells in a selected block. The program step voltage 635 is the voltage step size between programming voltage pulses. The program inhibit start voltage 636 is a voltage used to inhibit further programming of data cells once the Vt level associated with a desired data state has been reached. The erase verify voltage 637 is the voltage used check whether memory cells in the selected block have a Vt level indicative of the erase state.

The particular operating voltage parameters associated with setA, setB, and setC also include a number of read reference voltages 638-1 (R1), 638-2 (R2), and 638-3 (R3), along with a number of program verify voltages 639-1 (PV1), 639-2 (PV2), and 639-3 (PV3). As illustrated in FIG. 3B, the program verify voltages 639-1, 639-2, and 639-3 can represent target voltage levels to which data cells are to be programmed in order to represent a particular data state. Also as described in connection with FIG. 3B, the read reference voltages 638-1, 638-2, and 638-3, are voltage levels that can be located between program Vt distributions and used to determine a particular data state of a data cell during a data read operation.

As illustrated in table 601, the programming start voltage 634 and program step voltage 635 corresponding to operating trim voltage setA are greater than the programming start voltage 634 and program step voltage 635 corresponding to operating trim voltage setB. Also, the programming start voltage 634 and program step voltage 635 corresponding to operating trim voltage setB are greater than the programming start voltage 634 and program step voltage 635 corresponding to operating trim voltage setC. That is, in various embodiments, the programming start voltage 634 and/or the program step voltage 635 associated with programming data cells of a selected block can be decreased as the number of reference cells having a Vt level greater than the particular reference level in response to the programming monitor operation increases, e.g. due to greater program/erase cycling. In this manner, an appropriate set of operating trim voltages used for programming the data cells of a selected block is selected based on the monitored programming performance of the reference cells in response to a program monitor operation in accordance with embodiments of the present disclosure.

In various embodiments, and as illustrated in table 601, the erase verification voltage 637 can be adjusted, e.g., increased in this example, based on the programming performance of the reference cells in response to the programming monitor operation, e.g., operation 525 shown in FIG. 5A. As shown in table 601, the erase verify voltage 637 is 0.0V for setA, 0.1V for setB, and 0.2V for setC. That is, the particular erase verify voltage 637 associated with each selectable set of operating trim voltages, and used during an erase verify operation, increases as the determined number of reference cells having a Vt level greater than the reference level, e.g., Vt_ref, in response to the programming monitor operation, increases. The erase verify voltage 637 selected to be used an be increased due to charge trapping effects associated with strings of memory cells, which can make it more difficult to erase memory cells to a particular desired erase Vt level.

Embodiments of the present disclosure are not limited to the examples illustrated in FIGS. 6A and 6B. For instance, in various embodiments, the number of operating parameters associated with each of the sets of operating trim voltage sets can be more or fewer than those shown in table 601. Also, the number of sets of operating trim voltage sets is not limited to three, e.g., setA, setB and setC, as shown in FIGS. 6A and 6B.

Figures 7A, 7B:
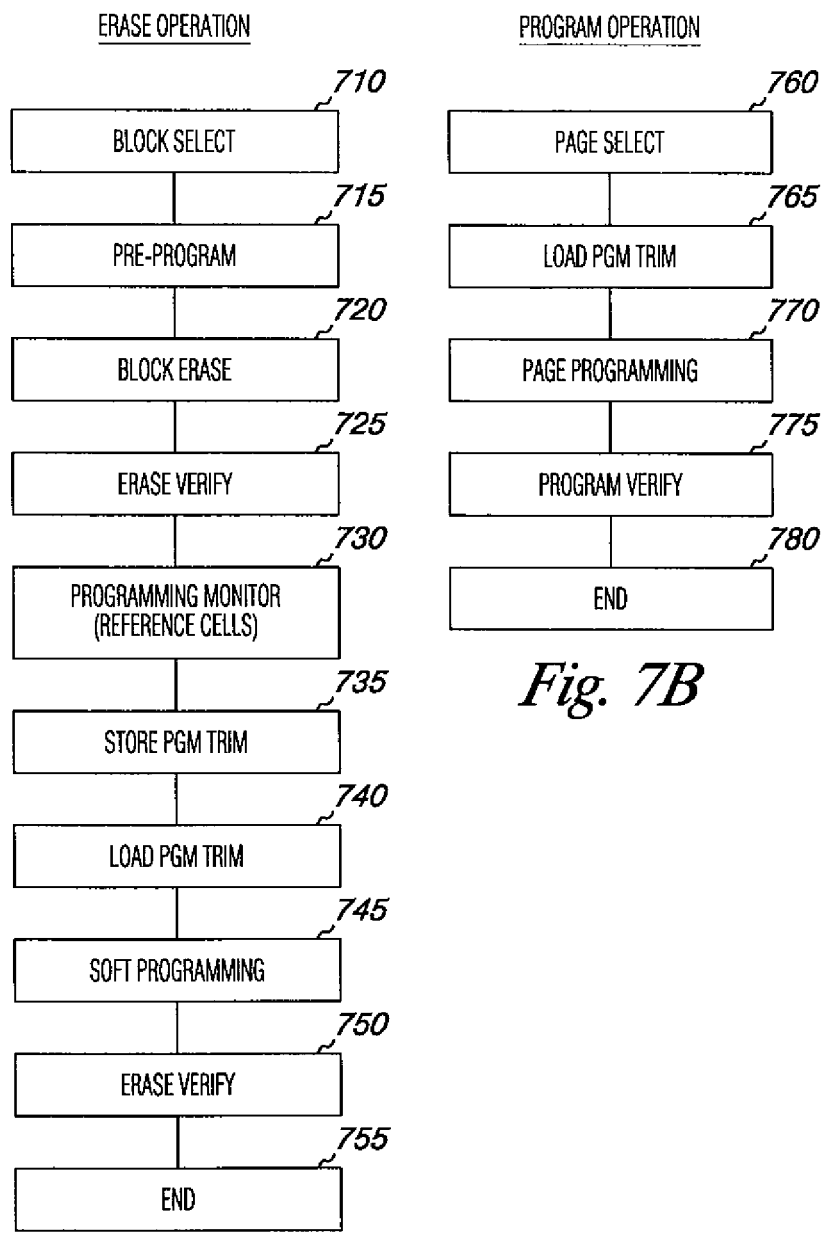
FIG. 7A illustrates a block diagram of a method for operating an array of memory cells according to an embodiment of the present disclosure.
FIG. 7B illustrates a block diagram of a method for operating an array of memory cells according to an embodiment of the present disclosure.

FIG. 7A illustrates a block diagram of a method for operating an array of memory cells according to an embodiment of the present disclosure. FIG. 7A illustrates an example of an erase operation that can be performed on a block of memory cells in accordance with an embodiment of the present disclosure. In one or more embodiments, the array can be a NAND array of non-volatile memory cells, e.g., array 100 shown in FIG. 1.

At block 710, the method includes selecting a block of a number of blocks of memory cells having a number of data cells and a number of reference cells. The block can have various numbers of reference cells and data cells, and the reference cells can be placed at various physical locations in the array. Examples of physical locations of reference cells are described below in connection with FIGS. 8A, 8B, and 8C. Each of the number of blocks has an associated set of particular operating parameters, e.g. operating voltages, used to program the number of data cells. The associated set of particular operating voltages can include a programming start voltage and a program step voltage, among various other operating voltages such as those shown in FIG. 6B.

At block 715, the erase operation illustrated in FIG. 7A includes a pre-programming operation. The pre-programming operation can be performed on the reference cells and the data cells of the selected block of memory cells. As one of ordinary skill in the art will appreciate, a pre-programming operation can be used to narrow the Vt distribution associated with a number of memory cells prior to a block erase operation. That is, the pre-programming can result in the Vt levels of the memory cells having a relatively uniform value prior to receiving one or more block erase pulses.

At block 720, the method includes performing a block erase operation on the number of data cells and the number of reference cells of the selected block. The data cells and reference cells of the selected block can be erased together in a substantially simultaneous manner via application of one or more relatively high erase voltage pulses. An example of the biasing voltages associated with a block erase operation are shown in table 500 of FIG. 5A.

At block 725, the erase operation illustrated in FIG. 7A includes performing an erase verify operation on the memory cells of the selected block. In some embodiments, the erase verify operation can be performed on only the data cells of the selected block. An erase verify operation can be used to ensure the Vt level of the respective cells has been erased to a suitable level. One example of an erase verify operation is illustrated in table 500 of FIG. 5A.

At block 730, the erase operation illustrated in FIG. 7A includes performing a programming monitor operation on the number of reference cells of the selected block. In various embodiments, and as illustrated in the embodiment shown in FIG. 7A, the programming monitor operation is performed as part of the erase operation. That is, the programming monitor operation can be performed on the reference cells before programming the number of data cells of the selected block. As described above, the programming monitor operation can include applying a voltage pulse have a particular magnitude to a control gate of each of the number of reference cells and determining an amount of the number of reference cells whose threshold voltage (Vt) reaches a particular level in response to the applied voltage pulse. The number of reference cells whose Vt level is greater than the particular reference level can be determined by sensing whether a bit line coupled to the reference cells conducts current during a read operation such as read operation 528 described in FIG. 5B.

In various embodiments, the method includes adjusting at least one of the associated set of particular operating voltages used to program the number of data cells of the selected first block based, at least partially, on the programming monitor operation performed on the number of reference cells of the selected block. As an example, adjusting the at least one of the associated set of particular operating voltages used to program the number of data cells can include decreasing the programming start voltage and/or program step voltage used to program the data cells. The number of reference cells whose Vt level is greater than the particular reference level in response to the programming monitor operation correlates to the program/erase cycles experienced by the memory cells of the array. As such, the amounts by which the particular operating voltages are adjusted can be based on the number of reference cells whose Vt level is determined to be above the reference level in response to the applied voltage pulse, e.g., pulse Vpgm_mon 403 shown in FIG. 4.

In various embodiments, the method can include selecting at least a second block of memory cells in the array, erasing the number of data cells and the number of reference cells of the at least a second block, performing the programming monitor operation on the number of reference cells of the selected at least second block before programming the number of data cells of the selected at least second block, and adjusting at least one of the associated set of particular operating voltages used to program the number of data cells of the selected at least second block based on the programming monitor operation performed on the number of reference cells of the selected at least second block. In such embodiments, the method can include adjusting the at least one of the associated set of particular operating voltages used to program the number of data cells of the selected at least second block by a different amount than the at least one of the associated set of particular operating voltages used to program the number of data cells of the selected first block.

At block 735, the erase operation illustrated in FIG. 7A includes storing programming trim data associated with programming the data cells of the selected block of memory cells. For example, trim data corresponding to particular adjusted operating voltages can be stored by reference cells of the selected block. The adjusted operating voltages can then be used to perform a programming operation on data cells of the selected block, e.g., a programming operation such as that described in connection with FIG. 7B. At block 740, the erase operation illustrated in FIG. 7A includes loading the programming trim data. As an example, the loaded trim data can correspond to operating voltage levels used to perform a soft-programming operation on the memory cells of the selected block.

At block 745, the erase operation illustrated in FIG. 7A includes performing a soft-programming operation on the memory cells of the selected block. The soft-programming operation can be performed on the reference cells and the data cells of the selected block. As one of ordinary skill in the art will appreciate, a soft-programming operation can be used to adjust the threshold voltage level of memory cells which may have experienced an over erased condition as a result of a block erase operation.

At block 750, the erase operation illustrated in FIG. 7A includes performing an erase verification operation on the memory cells of the selected block. In some embodiments, the erase verify operation can be performed on only the data cells of the selected block. An erase verify operation can be used to ensure the Vt level of the respective cells has been erased to a suitable level. One example of an erase verify operation is illustrated in table 500 of FIG. 5A.

Block 750 of the erase operation illustrated in FIG. 7A indicates that the erase operation has ended. Subsequent to an erase operation such as that illustrated in FIG. 7A, data can be programmed to the data cells of the selected block. As discussed above, in various embodiments, a number of operating voltages associated with programming the data cells of a selected block can depend on the performance of the reference cells in response to the programming monitor operation, e.g., 730, performed on the reference cells.

FIG. 7B illustrates a block diagram of a method for operating an array of memory cells according to an embodiment of the present disclosure. FIG. 7B illustrates an example of a programming operation that can be performed on data cells of a selected block of memory cells in accordance with an embodiment of the present disclosure.

At block 760, the programming operation illustrated in FIG. 7B includes selecting a page of data to be programmed to one or more blocks of the memory array.

At block 765, the programming operation illustrated in FIG. 7B includes loading programming trim data. As an example, the programming trim data can be the trim data stored during an erase operation such as that described in FIG. 7A. As such, the trim data can correspond to operating voltage levels used to program the data cells of the selected block. That is, the trim data can correspond to adjusted operating parameters as determined based, at least partially, on a programming monitor operation performed on the reference cells of the selected block as part of an erase operation such as that described in FIG. 7A.

At block 770, the programming operation illustrated in FIG. 7B includes programming the page of data to one or more blocks of the memory array using one or more adjusted operating parameters, e.g., voltages. At block 775, the programming operation illustrated in FIG. 7B includes performing a program verification operation on the data cells of a selected block.

Block 780 of the programming operation illustrated in FIG. 7B indicates that the programming operation has ended. That is, the selected page of data has been programmed to the data cells of a selected block using one or more operating voltages as determined based on a programming operation performed on reference cells of the selected block as part of an erase operation.

Figure 8A:
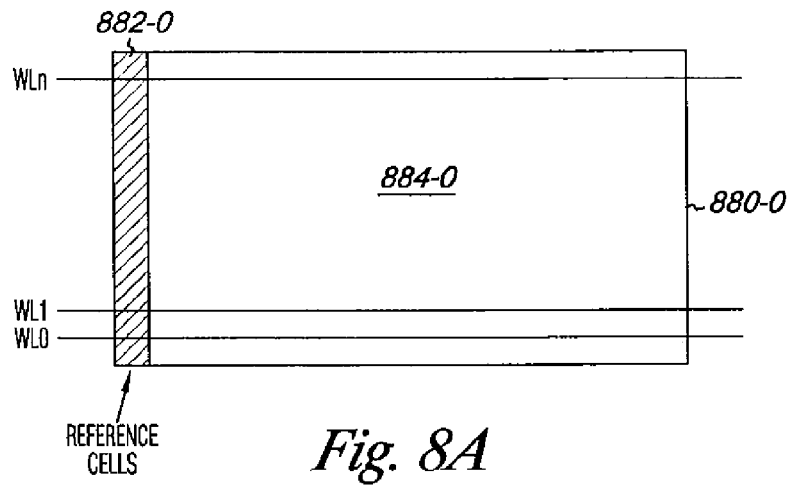
FIG. 8A illustrates a block of memory cells including data cells and reference cells in accordance with an embodiment of the present disclosure.

FIG. 8A illustrates a block 880-0 of memory cells including data cells and reference cells in accordance with an embodiment of the present disclosure. In the example illustrated in FIG. 8A, portion 882-0 of the array 880-0 represents a number of reference memory cells, and portion 884-0 represents a number of data memory cells. In the embodiment illustrated in FIG. 8A, the array 880-0 is physically configured such that each of the word lines (WL0, WL1, . . . , WLn) is coupled to at least one reference cell of portion 882-0. That is, portion 882-0 represents at least one string of reference memory cells. Embodiments are not so limited. For example, the portion 882-0 can include a number of strings of reference memory cells, e.g., 64, 128, or 256 strings, among other numbers of strings of reference cells. In various embodiments, a block, e.g., 880-0, can have only one string of reference cells. The number of strings of reference cells corresponding to portion 882-0 can depend on factors such as the number of data memory cells in block 880-0 and/or the number of strings of data cells in portion 884-0, among other factors.

Figure 8B:
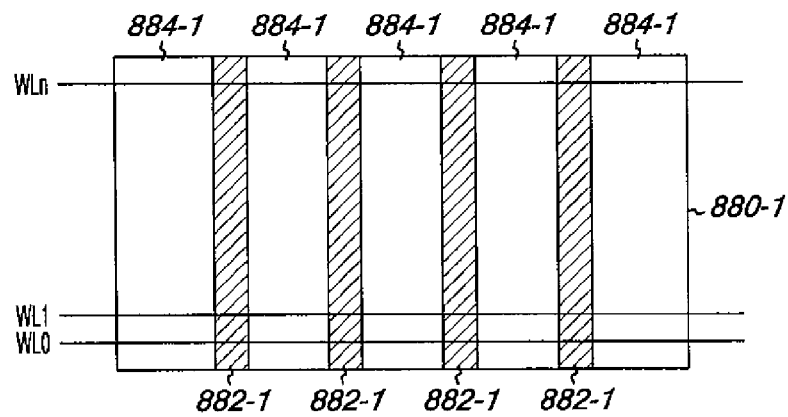
FIG. 8B illustrates a block of memory cells including data cells and reference cells in accordance with an embodiment of the present disclosure.

FIG. 8B illustrates a block 880-1 of memory cells including data cells and reference cells in accordance with an embodiment of the present disclosure. In the example illustrated in FIG. 8B, portions 882-1 of the array 880-1 represent a number of reference memory cells, and portions 884-1 represents a number of data memory cells. In the embodiment illustrated in FIG. 8B, the array 880-1 is physically configured such that each of the word lines (WL0, WL1, . . . , WLn) is coupled to at least one reference cell of portions 882-1. That is, each of portions 882-1 represent at least one string of reference memory cells. Unlike the example illustrated in FIG. 8A, in the example illustrated in FIG. 8B, the strings of reference cells are distributed throughout the block 880-1.

Figure 8C:
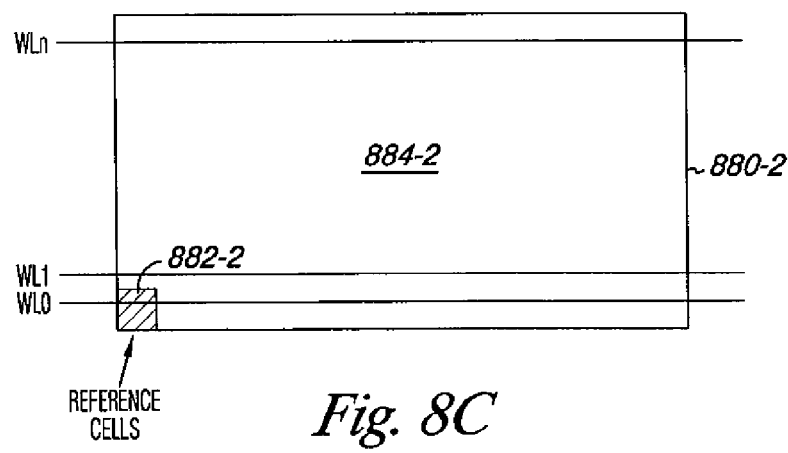
FIG. 8C illustrates a block of memory cells including data cells and reference cells in accordance with an embodiment of the present disclosure.

FIG. 8C illustrates a block 880-2 of memory cells including data cells and reference cells in accordance with an embodiment of the present disclosure. In the example illustrated in FIG. 8C, portion 882-2 of the array 880-1 represents a number of reference memory cells, and portion 884-2 represents a number of data memory cells. In the embodiment illustrated in FIG. 8C, the array 880-2 is physically configured such that only one of the word lines, e.g., WL0 in this example, is coupled to reference cells. However, the word line WL0 is coupled to a number of data cells of portion 884-2 as well as the reference cells of portion 882-2.

As described in connection with FIGS. 5A and 5B, in some embodiments, a block of memory cells can include one or more word lines consisting entirely of reference cells. In such embodiments, the word lines containing reference cells can physically located at the top and/or bottom of a block of memory cells or can be distributed throughout the block. Embodiments of the present disclosure are not limited to the physical locations of data cells and reference cells within a block as shown in the examples of FIGS. 8A, 8B, and 8C.

Figure 9:
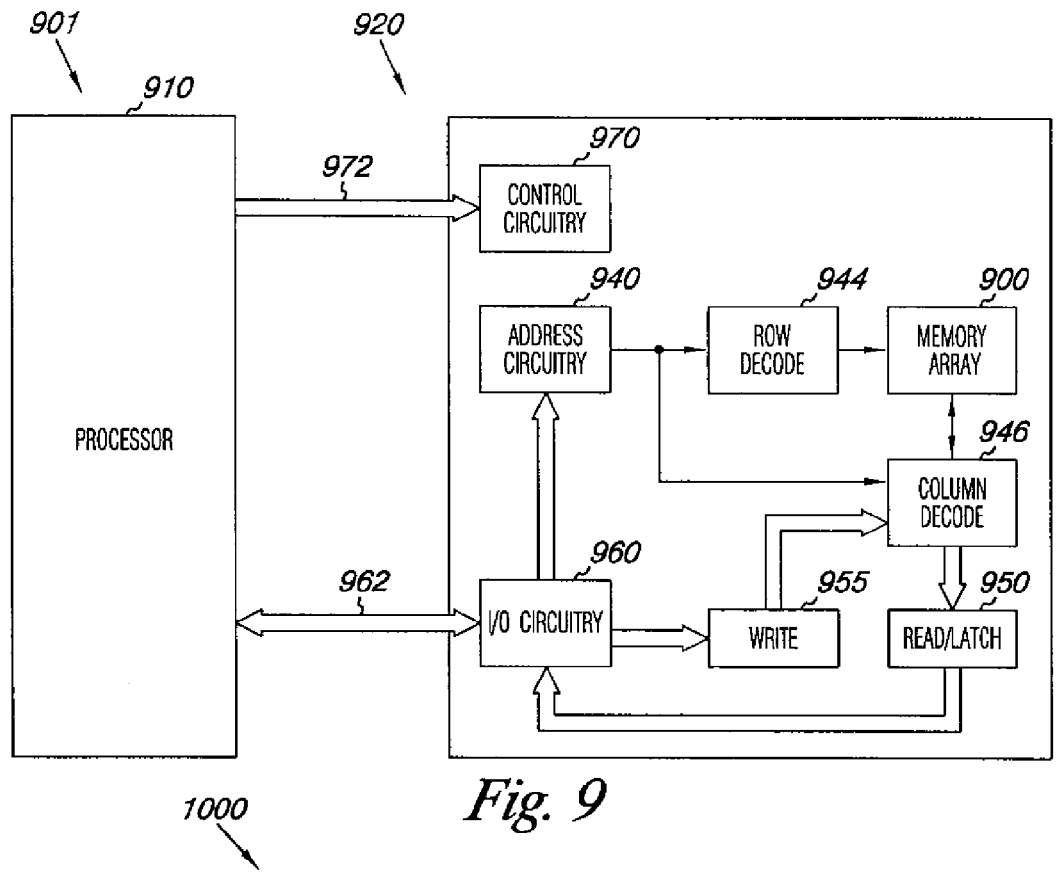
FIG. 9 is a functional block diagram of an electronic memory system having at least one memory device in accordance with an embodiment of the present disclosure.

FIG. 9 is a functional block diagram of an electronic memory system 901 having at least one memory device 920 in accordance with an embodiment of the present disclosure. Memory system 901 includes a processor 910 coupled to a non-volatile memory device 920 that includes a memory array 900 of non-volatile memory cells. The memory array 900 can be an array such as array 100 described in connection with FIG. 1 and can include a number of reference memory cells and a number of data memory cells in accordance with embodiments described herein. The memory system 901 can include separate integrated circuits or both the processor 910 and the memory device 920 can be on the same integrated circuit. The processor 910 can be a microprocessor or some other type of controlling circuitry such as an application-specific integrated circuit (ASIC).

The memory device 920 includes an array 900 of non-volatile memory cells, which can be floating gate flash memory cells with a NAND architecture. The control gates of each row of memory cells are coupled with a word line, while the drain regions of the memory cells are coupled to bit lines. The source regions of the memory cells are coupled to source lines, as the same has been illustrated in FIG. 1. As will be appreciated by those of ordinary skill in the art, the manner of connection of the memory cells to the bit lines and source lines depends on whether the array is a NAND architecture, a NOR architecture, and AND architecture, or some other memory array architecture.

The embodiment of FIG. 9 includes address circuitry 940 to latch address signals provided over I/O connections 962 through I/O circuitry 960. Address signals are received and decoded by a row decoder 944 and a column decoder 946 to access the memory array 900. In light of the present disclosure, it will be appreciated by those skilled in the art that the number of address input connections depends on the density and architecture of the memory array 900 and that the number of addresses increases with both increased numbers of memory cells and increased numbers of memory blocks and arrays.

The memory array 900 of non-volatile memory cells can include data memory cells and reference memory cells according to embodiments described herein. The memory device 920 reads data in the memory array 900 by sensing voltage and/or current changes in the memory array columns using sense/buffer circuitry that in this embodiment can be read/latch circuitry 950. The read/latch circuitry 950 can read and latch a page or row of data from the memory array 900. I/O circuitry 960 is included for bi-directional data communication over the I/O connections 962 with the processor 910. Write circuitry 955 is included to write data to the memory array 900.

Control circuitry 970 decodes signals provided by control connections 972 from the processor 910. These signals can include chip signals, write enable signals, and address latch signals that are used to control the operations on the memory array 900, including data read, data write, and data erase operations. In various embodiments, the control circuitry 970 is responsible for executing instructions from the processor 910 to perform the operating embodiments of the present disclosure. The control circuitry 970 can be a state machine, a sequencer, or some other type of controller. It will be appreciated by those skilled in the art that additional circuitry and control signals can be provided, and that the memory device detail of FIG. 9 has been reduced to facilitate ease of illustration.

Figure 10:
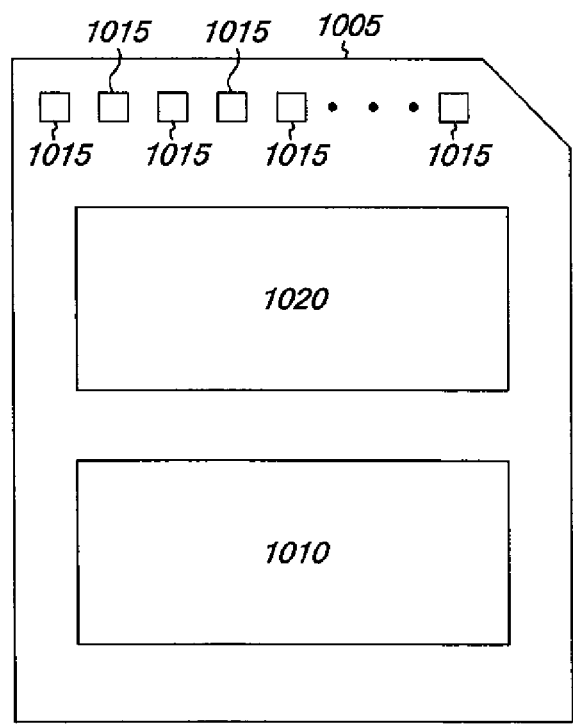
FIG. 10 is a functional block diagram of a memory module having at least one memory device in accordance with an embodiment of the present disclosure.

FIG. 10 is a functional block diagram of a memory module 1000 having at least one memory device in accordance with an embodiment of the present disclosure. Memory module 1000 is illustrated as a memory card, although the concepts discussed with reference to memory module 1000 are applicable to other types of removable or portable memory (e.g., USB flash drives) and are intended to be within the scope of "memory module" as used herein. In addition, although one example form factor is depicted in FIG. 10, these concepts are applicable to other form factors as well.

In some embodiments, memory module 1000 will include a housing 1005 (as depicted) to enclose one or more memory devices 1010, though such a housing is not essential to all devices or device applications. At least one memory device 1010 includes an array of non-volatile multilevel memory cells that includes data cells and reference cells that can be operated, e.g., programmed, erased, and/or read, according to embodiments described herein. Where present, the housing 1005 includes one or more contacts 1015 for communication with a host device. Examples of host devices include digital cameras, digital recording and playback devices, PDAs, personal computers, memory card readers, interface hubs and the like. For some embodiments, the contacts 1015 are in the form of a standardized interface. For example, with a USB flash drive, the contacts 1015 might be in the form of a USB Type-A male connector. For some embodiments, the contacts 1015 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 1015 provide an interface for passing control, address and/or data signals between the memory module 1000 and a host having compatible receptors for the contacts 1015.

The memory module 1000 may optionally include additional circuitry 1020, which may be one or more integrated circuits and/or discrete components. For some embodiments, the additional circuitry 1020 may include control circuitry, such as a memory controller, for controlling access across multiple memory devices 1010 and/or for providing a translation layer between an external host and a memory device 1010. For example, there may not be a one-to-one correspondence between the number of contacts 1015 and a number of 1010 connections to the one or more memory devices 1010. Thus, a memory controller could selectively couple an I/O connection (not shown in FIG. 10) of a memory device 1010 to receive the appropriate signal at the appropriate I/O connection at the appropriate time or to provide the appropriate signal at the appropriate contact 1015 at the appropriate time. Similarly, the communication protocol between a host and the memory module 1000 may be different than what is required for access of a memory device 1010. A memory controller could then translate the command sequences received from a host into the appropriate command sequences to achieve the desired access to the memory device 1010. Such translation may further include changes in signal voltage levels in addition to command sequences.

The additional circuitry 1020 may further include functionality unrelated to control of a memory device 1010 such as logic functions as might be performed by an ASIC. Also, the additional circuitry 1020 may include circuitry to restrict read or write access to the memory module 1000, such as password protection, biometrics or the like. The additional circuitry 1020 may include circuitry to indicate a status of the memory module 1000. For example, the additional circuitry 1020 may include functionality to determine whether power is being supplied to the memory module 1000 and whether the memory module 1000 is currently being accessed, and to display an indication of its status, such as a solid light while powered and a flashing light while being accessed. The additional circuitry 1020 may further include passive devices, such as decoupling capacitors to help regulate power requirements within the memory module 1000.

CONCLUSION

Methods, devices, modules, and systems for operating non-volatile memory cells have been described herein. One method includes: performing an erase operation on a selected group of memory cells, the selected group including a number of reference cells and a number of data cells; performing a programming monitor operation on the number of reference cells as part of the erase operation; and determining a number of particular operating parameters associated with operating the number of data cells at least partially based on the programming monitor operation performed on the number of reference cells.

Although specific embodiments have been illustrated and described herein, those ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating an array of memory cells that includes data cells and reference cells, the method comprising:
   performing an erase operation on a selected group of memory cells, the selected group including a number of reference cells and a number of data cells, wherein the number of data cells are associated with a number of particular operating parameters;
   as a part of the erase operation and prior to programming the number of data cells, applying a voltage pulse having a particular magnitude to the number of reference cells;
   determining an amount of the number of reference cells whose threshold voltage reaches a particular level in response to the applied voltage pulse; and
   adjusting at least one of the number of particular operating parameters associated with the number of data cells based on the determined amount of the number of reference cells.

2. The method of claim 1, wherein adjusting the at least one of the number of particular operating parameters includes adjusting a magnitude of an initial programming pulse of a series of incremented programming pulses used to program the number of data cells.

3. The method of claim 2, wherein adjusting comprises decreasing the magnitude of the initial programming pulse of the series of incremented programming pulses used to program the number of data cells.

4. The method of claim 2, wherein adjusting the at least one of the number of particular operating parameters includes adjusting a step size associated with the series of incremented programming pulses used to program the number of data cells.

5. The method of claim 4, wherein adjusting comprises decreasing the magnitude of the step size associated with the series of incremented programming pulses used to program the number of data cells.

6. The method of claim 1, wherein:
   the selected group of memory cells is a selected block of memory cells of a number of blocks of memory cells in the array;
   each of the number of blocks includes a number of reference cells, a number of data cells, and a number of particular operating voltages associated with operating the number of data cells;
   the number of data cells of at least one of the number of blocks is associated with at least one operating voltage different from the number of particular operating voltages associated with the number of data cells of the selected block; and
   the method includes adjusting at least one of the number of particular operating voltages associated with the number of data cells in each of the number of blocks on block by block basis.

7. A method for operating an array of non-volatile memory cells that includes data cells and reference cells, the method comprising:
   selecting a first block of a number of blocks of memory cells having a number of data cells and a number of reference cells, each of the number of blocks having an associated set of particular operating parameters used to program the number of data cells;
   performing an erase operation on the number of data cells and the number of reference cells of the selected first block;
   as a part of the erase operation, performing a programming monitor operation on the number of reference cells of the selected first block before programming the number of data cells of the selected first block; and
   adjusting at least one of the associated set of particular operating parameters used to program the number of data cells of the selected first block based, at least partially, on the programming monitor operation performed on the number of reference cells of the selected first block.

8. The method of claim 7, wherein performing the programming monitor operation includes:
   applying a voltage pulse having a particular magnitude to a control gate of each of the number of reference cells; and determining an amount of the number of reference cells whose threshold voltage reaches a particular level in response to the applied voltage pulse.

9. The method of claim 8, including sensing a current conducted by a number of bit lines to which the number of reference cells are coupled to determine the amount of the number of reference cells whose threshold voltage reaches the particular level.

10. The method of claim 7, wherein the method includes:
selecting at least a second block;
performing an erase operation on the number of data cells and the number of reference cells of the at least a second block;
performing the programming monitor operation on the number of reference cells of the selected at least second block before programming the number of data cells of the selected at least second block; and
adjusting at least one of the associated set of particular operating parameters used to program the number of data cells of the selected at least second block based on the programming monitor operation performed on the number of reference cells of the selected at least second block.

11. The method of claim 10, including adjusting the at least one of the associated set of particular operating parameters used to program the number of data cells of the selected at least second block by a different amount than the at least one of the associated set of particular operating parameters used to program the number of data cells of the selected first block.

12. A method for operating an array of memory cells that includes data cells and reference cells, the method comprising:
as a part of an erase operation, applying a programming voltage pulse to an access line coupled to each of a number of reference cells;
determining an amount of the number of reference cells whose threshold voltage reaches a particular level in response to the applied programming voltage pulse;
selecting an adjusted set of particular operating voltages based, at least partially, on the determined amount of the number of reference cells whose threshold voltage reaches the particular level in response to the applied programming voltage pulse; and
programming a number of data cells using at least one adjusted programming voltage from the adjusted set of particular operating voltages.

13. The method of claim 12, wherein programming the number of data cells comprises applying a number of voltage pulses to an access line to which the number of data cells are coupled.

14. The method of claim 13, wherein the number of data cells and the number of reference cells are coupled to a same access line.

15. The method of claim 12, wherein the method includes applying the programming voltage pulse to the access line coupled to each of the number of reference cells prior to applying an erase voltage pulse to the access line coupled to each of the number of reference cells.

16. The method of claim 12, wherein the method includes applying the programming voltage pulse to the access line coupled to each of the number of reference cells subsequent to applying an erase voltage pulse to the access line coupled to each of the number of reference cells.

17. The method of claim 12, wherein the method includes applying the programming voltage pulse to the access line coupled to each of the number of references cells as part of a programming monitor operation performed on the reference cells.

18. The method of claim 12, wherein the method includes adjusting a magnitude of the programming voltage pulse based on the determined amount of the number of reference cells whose threshold voltage reaches the particular level in response to the applied programming pulse.

19. The method of claim 12, wherein the at least one adjusted programming voltage includes an adjusted programming start voltage.

20. The method of claim 19, wherein the method includes decreasing the adjusted programming start voltage.

\* \* \* \* \*